United States Patent
Chen et al.

(10) Patent No.: US 11,451,235 B2
(45) Date of Patent: Sep. 20, 2022

(54) TIME INTERLEAVED ANALOG-TO-DIGITAL CONVERTER

(71) Applicant: REALTEK SEMICONDUCTOR CORPORATION, Hsinchu (TW)

(72) Inventors: Yu-Chang Chen, Hsinchu (TW); Yun-Tse Chen, Hsinchu (TW); Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/225,162

(22) Filed: Apr. 8, 2021

(65) Prior Publication Data

US 2021/0359694 A1    Nov. 18, 2021

(30) Foreign Application Priority Data

May 15, 2020 (TW) ................................ 109116172

(51) Int. Cl.
*H03M 1/06* (2006.01)

(52) U.S. Cl.
CPC ....... *H03M 1/0673* (2013.01); *H03M 1/0663* (2013.01)

(58) Field of Classification Search
CPC ............. H03M 1/0673; H03M 1/0663; H03M 1/0624; H03M 1/0836; H03M 1/1215
USPC .................................................. 341/120–155
See application file for complete search history.

(56) References Cited

U.S. PATENT DOCUMENTS

| | | | |
|---|---|---|---|
| 7,292,170 B2 | 11/2007 | Kinyua et al. | |
| 10,868,556 B2* | 12/2020 | Camponeschi | H03M 1/0836 |
| 11,075,640 B1* | 7/2021 | Kang | H03M 1/0836 |
| 2006/0279445 A1* | 12/2006 | Kinyua | H03M 1/0624 |
| | | | 341/155 |
| 2016/0049949 A1* | 2/2016 | Waltari | H03M 1/1023 |
| | | | 341/120 |

(Continued)

FOREIGN PATENT DOCUMENTS

CN    101888247 A  * 11/2010  ............ H03M 1/485

OTHER PUBLICATIONS

Naoki Kurosawa et al., "Explicit Analysis of Channel Mismatch Effects in Time-Interleaved ADC Systems", Mar. 2001, pp. 261-271, vol. 48, No. 3, IEEE Transactions on Circuits and Systems-I: Fundamental Theory and Applications.

(Continued)

*Primary Examiner* — Lam T Mai
(74) *Attorney, Agent, or Firm* — WPAT, PC

(57) ABSTRACT

A time interleaved analog-to-digital converter (TIADC) is provided. The TIADC converts an input signal into a digital output signal and includes N analog-to-digital converters (ADCs), a clock generation circuit, and a control circuit. The N ADCs receive the input signal and sample the input signal according to N sampling clocks to each generate a digital output code, N being an integer greater than or equal to 2. The clock generation circuit is configured to receive a working clock and a set of control values and to generate the N sampling clocks according to the set of control values and the working clock. The control circuit is configured to periodically generate the set of control values based on a pseudo random number and to output the digital output codes in turn as the digital output signal.

9 Claims, 6 Drawing Sheets

(56) References Cited

U.S. PATENT DOCUMENTS

2020/0235748 A1* 7/2020 Kang .................. H03M 1/0836

OTHER PUBLICATIONS

Zouyi Jiang et al., "Mismatch error correction for time interleaved analog-to-digital converter over a wide frequency range", 2018, University of Science and Technology of China.

Behzad Razavi, "Problem of Timing Mismatch in Interleaved ADCs", 2012, IEEE.

Steven Huang et al., "Blind Calibration of Timing Offsets for Four-Channel Time-Interleaved ADCs", Apr. 2007, pp. 863-876,vol. 54, No. 4, IEEE Transactions on Circuits and Systems-I: Regular Papers.

Behzad Razavi, "Design Considerations for Interleaved ADCs", Aug. 2013, pp. 1806-1817, vol. 48, No. 8, , IEEE Journal of Solid-State Circuits.

OA letter of the counterpart TW application (appl. No. 109116172) dated Sep 18, 2020. Summary of the OA letter (1) Claims 1, 2, 4 and 7 are rejected under Taiwan Patent Law Article 22(1) as being anticipated by reference 1 (U.S. Pat. No. 7,292,170 B2). (2) Claims 3, 5-6, 8 and 9 are rejected under Taiwan Patent Law Article 22(2) as being unpatentable over reference 1 (U.S. Pat. No. 7,292,170 B2).).

\* cited by examiner

TIME INTERLEAVED ANALOG-TO-DIGITAL CONVERTER

BACKGROUND OF THE INVENTION

1. Field of the Invention

The present invention generally relates to time interleaved analog-to-digital converters (TIADCs), and, more particularly, to the suppression of the skew tones caused by the sampling timing skew of the TIADC.

2. Description of Related Art

A TIADC includes multiple sub-analog-to-digital converters (sub-ADCs), each sampling the input signal according to the sampling clocks of the same frequency but different phases and generating in turn their respective digital output codes as the output of the TIADC. For example, when the TIADC includes four sub-ADCs: ADC1, ADC2, ADC3, and ADC4, which sample the input signal in the order of ADC1→ADC2→ADC3→ADC4→ADC1→ADC2→ . . . , the phase difference between the sampling clock of ADC1 and the sampling clock of ADC2 is 90 degrees, the phase difference between the sampling clock of ADC2 and the sampling clock of ADC3 is 90 degrees, the phase difference between the sampling clock of ADC3 and the sampling clock of ADC4 is 90 degrees, and the phase difference between the sampling clock of ADC4 and the sampling clock of ADC1 is 90 degrees. If the frequency of the working clock of the TIADC is fs (i.e., the TIADC outputs a digital output code every 1/fs second(s)), then the frequencies of the sampling clocks of ADC1, ADC2, ADC3, and ADC4 are fs/4.

Due to the mismatches of the trace lengths, components and other factors, the phase differences between the sampling clocks of the sub-ADCs ADC2, ADC3, and ADC4 and the sampling clock of the sub-ADC ADC1 are not exactly 90 degrees, 180 degrees, and 270 degrees, but rather 90+x degrees, 180+y degrees, and 270+z degrees (x, y, z being rational numbers), respectively. The document "Behzad Razavi. Design Considerations for Interleaved ADCs. *IEEE JOURNAL OF SOLID-STATE CIRCUITS*, VOL. 48, NO. 8, AUGUST 2013" provides a method of obtaining the values of x, y and z.

A conventional method of correcting TIADCs uses three filters to respectively adjust the digital output codes of the sub-ADCs ADC2, ADC3, and ADC4 according to the values of x, y, and z, respectively, to offset or correct the errors caused by the phase errors (i.e., x, y, z). The disadvantage of this method is that the corrected TIADC often has residual skew tones in the frequency domain, which means that the phase differences between the corrected sampling clocks are not exactly 90 degrees, 180 degrees, and 270 degrees; for example, the phase differences after correction may be equivalent to 90+x1 degrees, 180+y1 degrees, and 270+z1 degrees, where x1, y1, and z1 are the residual values. When the residual values x1, y1, and z1 are fixed and non-zero, there are unwanted skew tones, which degrade the performance of the TIADC.

SUMMARY OF THE INVENTION

In view of the issues of the prior art, an object of the present invention is to provide a TIADC to reduce or suppress the skew tones caused by the sampling time skew.

According to one of the embodiments, a time interleaved analog-to-digital converter (TIADC) for converting an input signal into a digital output signal is provided. The TIADC includes a first analog-to-digital converter (ADC), a second ADC, a third ADC, a fourth ADC, a control circuit, and a clock generation circuit. The ADC receives the input signal and samples the input signal according to a first sampling clock to generate a first digital output code. The second ADC receives the input signal and samples the input signal according to a second sampling clock to generate a second digital output code. The third ADC receives the input signal and samples the input signal according to a third sampling clock to generate a third digital output code. The fourth ADC receives the input signal and samples the input signal according to a fourth sampling clock to generate a fourth digital output code. The control circuit, which is coupled to the first ADC, the second ADC, the third ADC, and the fourth ADC, periodically generates at least a part of a set of control values randomly, and outputs the first digital output code, the second digital output code, the third digital output code, and the fourth digital output code in turn as the digital output signal. The clock generation circuit, which is coupled to the first ADC, the second ADC, the third ADC, the fourth ADC, and the control circuit, receives a working clock and generates the first sampling clock, the second sampling clock, the third sampling clock, and the fourth sampling clock according to the set of control values and the working clock, so that a phase of at least one of the first sampling clock, the second sampling clock, the third sampling clock, and the fourth sampling clock is not fixed.

According to one of the embodiments, a TIADC for converting an input signal into a digital output signal is also provided. The TIADC includes N ADCs (N being an integer greater than or equal to two), a clock generation circuit, and a control circuit. Each of the N ADCs receives the input signal and samples the input signal according to one of N sampling clocks to generate a digital output code. The clock generation circuit, which is coupled to the N ADCs, receives a working clock and a set of control values, and generates the N sampling clocks according to the set of control values and the working clock. The control circuit, which is coupled to the N ADCs and the clock generation circuit, periodically generates the set of control values, and outputs the digital output codes in turn as the digital output signal. Two consecutive sets of control values are not identical.

According to one of the embodiments, a TIADC for converting an input signal into a digital output signal is also provided. The TIADC includes N ADCs (N being an integer greater than or equal to two), a clock generation circuit, and a control circuit. Each of the N ADCs receives the input signal and samples the input signal according to one of N sampling clocks to generate a digital output code. The clock generation circuit, which is coupled to the N ADCs, receives a working clock and a set of control values, and generates the N sampling clocks according to the set of control values and the working clock. The control circuit, which is coupled to the N ADCs and the clock generation circuit, periodically generates the set of control values based on a pseudo random number, and outputs the digital output codes in turn as the digital output signal.

The TIADC of the present invention adjusts the phase of the sampling clock using an unfixed value. In comparison with the conventional technology, the TIADC of the present invention can reduce or suppress the skew tones, thereby improving the performance of the TIADC.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes time interleaved analog-to-digital converters (TIADCs). On account of that some or all elements of the TIADCs could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

In this document, the term "coupled" and the term "connected" may mean "directly coupled" and "directly connected" respectively, or "indirectly coupled" and "indirectly connected" respectively. "Coupled" and "connected" may also be used to indicate that two or more elements cooperate or interact with each other.

Although the terms "first," "second," etc., may be used herein to describe various elements, these elements should not be limited by these terms. Rather, these terms are only used to distinguish one element from another. For example, a first element could be termed a second element, and, similarly, a second element could be termed a first element, without departing from the scope of the embodiments.

Figure 1:
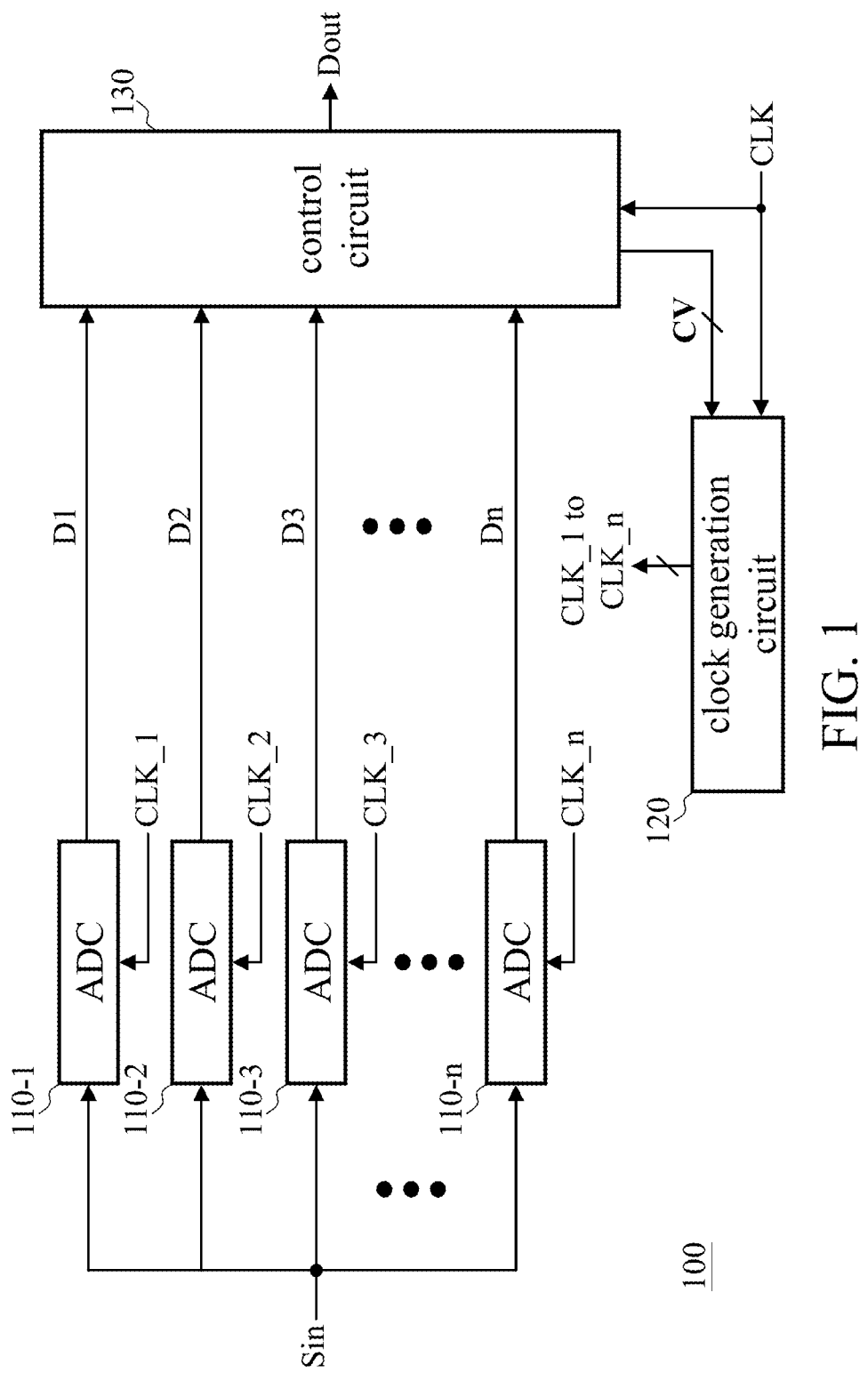
FIG. 1 shows a functional block diagram of a TIADC according to an embodiment of the present invention.

FIG. 1 shows a functional block diagram of a TIADC according to an embodiment of the present invention. The TIADC 100 includes n ADC 110 (110-1 to 110-$n$, n being an integer greater than or equal to 2), a clock generation circuit 120, and a control circuit 130.

The ADCs 110-1, 110-2, 110-3, . . . and 110-$n$ take turns to sample the input signal Sin according to the sampling clocks CLK_1, CLK_2, CLK_3, . . . , and CLK_n, respectively, and accordingly generate the digital output codes D1, D2, D3, . . . , and Dn, respectively.

The control circuit 130 is coupled to the ADC 110-1, 110-2, 110-3, . . . , and 110-$n$, and operates according to the working clock CLK. The control circuit 130 receives the digital output codes D1, D2, D3, . . . , and Dn, and sequentially outputs these digital output codes in turn as the digital output signal Dout. The control circuit 130 also periodically generates a set of control values CV (including control values CV1, CV2, CV3, . . . , CVn) according to the working clock CLK. In some embodiments, the control circuit 130 includes a multiplexer; the inputs of the multiplexer are the digital output codes (D1, D2, D3, . . . , and Dn) and the output of the multiplexer is the digital output signal Dout. The control circuit 130 controls, according to the working clock CLK, the multiplexer to output the digital output codes in turn.

The clock generation circuit 120, which is coupled to the n ADCs (110-1 to 110-$n$) and the control circuit 130, generates the sampling clocks CLK_1, CLK_2, CLK_3, . . . , and CLK_n according to the working clock CLK and the set of control values CV. The working clock CLK is of frequency fs, while the sampling clocks CLK_1, CLK_2, CLK_3, . . . , and CLK_n are of frequency fs/n; in other words, the sampling frequency of the TIADC 100 is equivalent to the frequency of the working clock CLK (i.e., fs).

Figure 2:
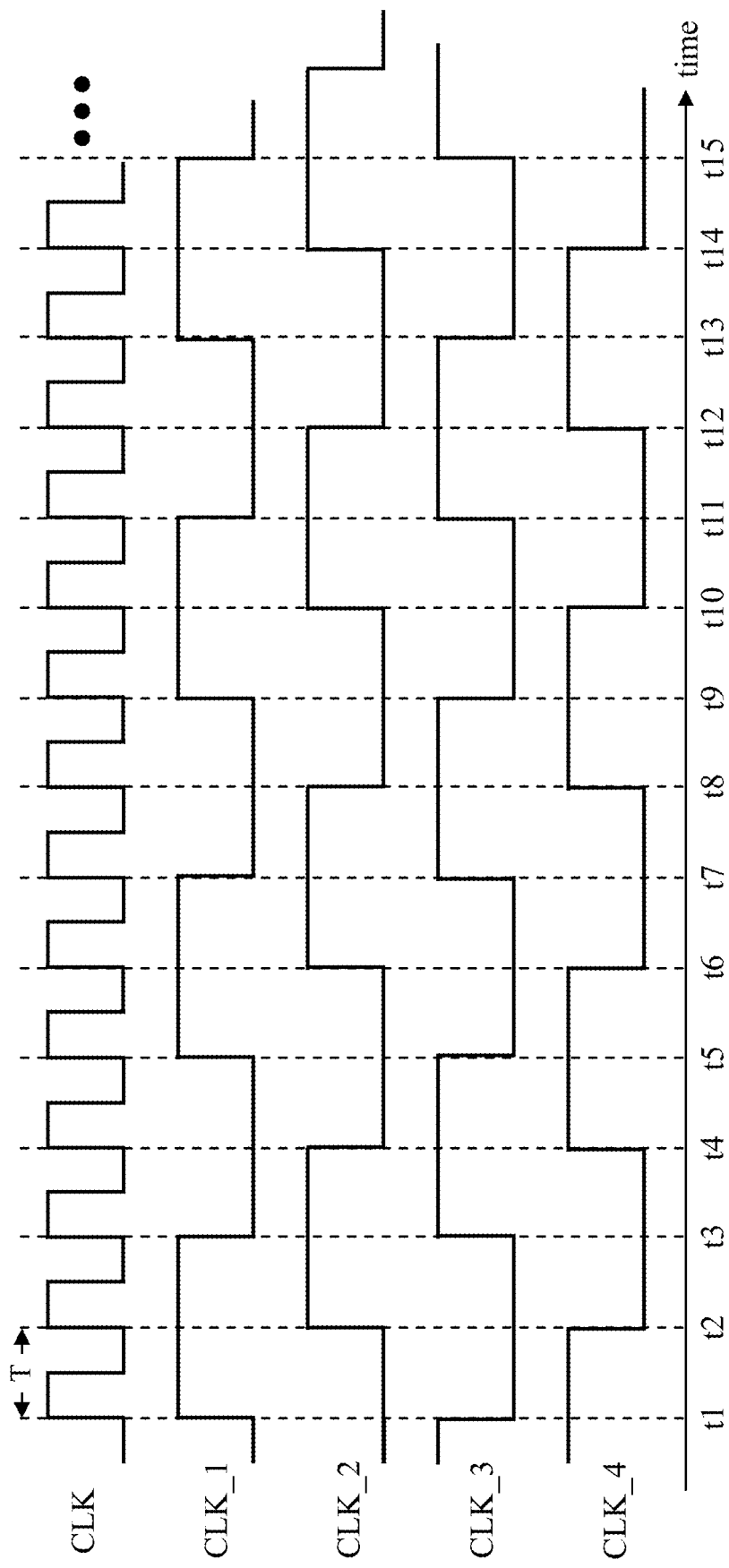
FIG. 2 is a timing diagram of the working clock CLK and the sampling clock.

FIG. 2 is a timing diagram of the working clock CLK and the sampling clocks. In FIG. 2 n=4 is intended to illustrate the invention by way of an example, rather than to limit the scope of the claimed invention. The period of the working clock CLK is T=1/fs, and each of the sampling clocks CLK_1, CLK_2, CLK_3, . . . , and CLK_n has a period of 4 T. The ADC 110-1 samples the input signal Sin at the rising edges of the sampling clock CLK_1 (i.e., at time points t1, t5, t9, . . . ), and generates a digital output code D1 within 4 T (i.e., one period of the sampling clock CLK_1). The ADC 110-2 samples the input signal Sin at the rising edges of the sampling clock CLK_2 (i.e., at time points t2, t6, t10, . . . ), and generates a digital output code D2 within 4 T (i.e., one period of the sampling clock CLK_2). Similar may be said with respect to the ADC 110-3 and the ADC 110-4, and shall be omitted herein for brevity. Therefore, the control circuit 130 receives a digital output code (D1, D2, D3, or D4) in each period of the working clock CLK. The control circuit 130, which operates according to the working clock CLK, sequentially outputs the digital output codes D1, D2, D3, and D4 in turn as the digital output signal Dout.

Figure 3:
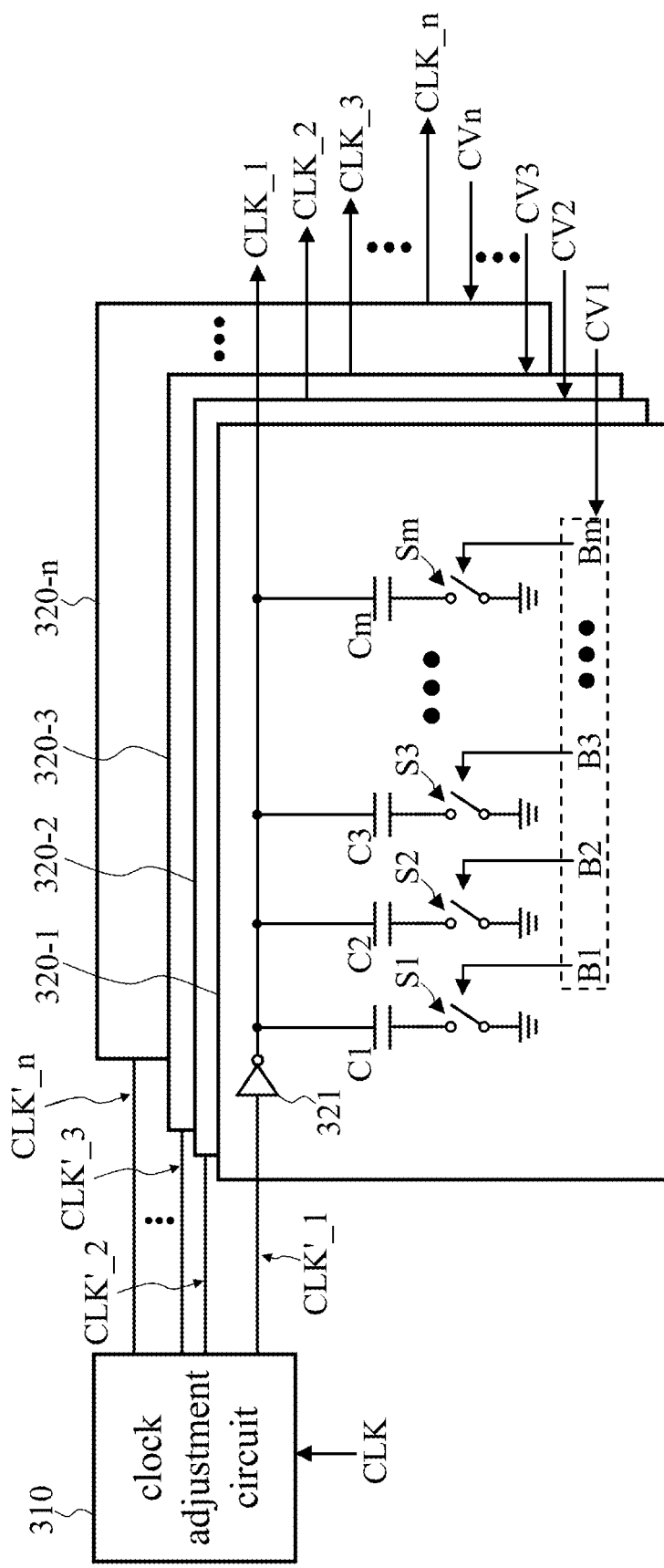
FIG. 3 is a circuit diagram of the clock generation circuit 120 according to an embodiment of the present invention.

FIG. 3 is a circuit diagram of the clock generation circuit 120 according to an embodiment of the present invention. The clock generation circuit 120 includes a clock adjustment circuit 310 and n phase adjustment circuits 320 (320-1, 320-2, 320-3, . . . , 320-$n$). The clock adjustment circuit 310 receives the working clock CLK, and generates, according to the working clock CLK, n intermediate clocks (CLK'_1, CLK'_2, CLK'_3, . . . , CLK'_n) that are respectively inputted to the n phase adjustment circuits 320. In some embodiments, the clock adjustment circuit 310 uses a frequency divider to divide the working clock CLK by n to generate a low-frequency clock, and the clock adjustment circuit 310 delays the phase of the low-frequency clock by a multiple k of (360/n) (i.e., k*(360/n)) to generate the intermediate clocks, respectively (k being an integer and 0≤k≤n−1). For example, when n=4, the phase difference between the intermediate clock inputted to the phase adjustment circuit 320-1 and the low-frequency clock is 0*(360/4)=0 degrees, the phase difference between the intermediate clock inputted to the phase adjustment circuit 320-2 and the low-frequency clock is 1*(360/4)=90 degrees, the phase difference between the intermediate clock inputted to the phase adjustment circuit 320-3 and the low-frequency clock is 2*(360/4)=180 degrees, and the phase difference between the intermediate clock inputted to the phase adjustment circuit 320-4 and the low-frequency clock is 3*(360/4)=270 degrees.

Each phase adjustment circuit 320 includes an inverter 321, m capacitors C (C1 to Cm, m being an integer greater than or equal to 1), and m switches S (S1 to Sm). The inverter 321 increases the driving capability of the intermediate clock. The m switches S are controlled by the control value (CV1, CV2, CV2, ..., or CVn) (bit B1 controlling the switch S1, bit B2 controlling the switch S2, bit B3 controlling the switch S3, ..., bit Bm controlling the switch Sm) to change the equivalent capacitance value of the capacitor group which is composed of the capacitors C1 to Cm. In other words, the phase of the sampling clock CLK_1 can be fine-tuned by changing the control value CV1 (the larger the equivalent capacitance value of the capacitor group, the greater phase by which the intermediate clock is delayed). Similarly, the phases of the sampling clock CLK_2, the sampling clock CLK_3, ..., and the sampling clock CLK_n can be fine-tuned by changing the control value CV2, the control value CV3, ..., and the control value CVn, respectively. In some embodiments, the capacitance values of the capacitors C1 to Cm may be the same, or increase in a binary progression.

By adjusting the set of control values CV, the control circuit 130 can offset or correct the phase errors of the sampling clocks CLK_1 to CLK_n. For example, if the phase of the sampling clock CLK_1 is advanced by x (i.e., having a phase delay of –x), the control circuit 130 can control the phase adjustment circuit 320-1, through the control value CV1, to generate a phase delay of +x to offset or correct the sampling clock CLK_1.

The control circuit 130 generates a set of control values CV every n periods of the working clock CLK (i.e., every nT), and two consecutive sets of control values CV are not completely the same. More specifically, the set of control values CV generated by the control circuit 130 between the time points t5 and t9 is not identical to the set of control values CV generated between the time points t1 and t5 and not identical to the set of control values CV generated between the time points t9 and t13. For example, in some instances, for two consecutive sets of control values CV, only one control value (e.g., CV1) changes, but the other control values (e.g., CV2 to CVn) remain unchanged. In another example, in some instances, for two consecutive sets of control values CV, all control values (CV1 to CVn) change.

The control circuit 130 generates the set of control values CV in a random number. As a result, the residual phase of at least one of the corrected sampling clocks CLK_1 to CLK_n is not a fixed value (i.e., at least one of the corrected sampling clocks CLK_1 to CLK_n is of different phases for two consecutive periods), so the aforementioned skew tone can be reduced or suppressed. In some embodiments, the control circuit 130 uses a pseudo random number (PRN) as the control value CV, and controls the average of the control value CV over a certain time period to substantially correspond to the phase difference value to be offset or corrected. For example, the control value CV1 is a random number (which means the two control values CV1 corresponding to two consecutive periods of the sampling clock are not identical), and the average of the control value CV1 over a certain time period is equivalent to controlling the phase adjustment circuit 320-1 to generate a phase delay of +x. For example, if the control values CV1 in ten consecutive periods of the sampling clock correspond respectively to the phase delays of x+1, x, x–2, x, x+3, x–2, x+2, x–1, x, and x–1, then the control values CV1 in these ten periods are, on average, equivalent to corresponding to a phase delay of +x, with the residual phase of the sampling clock CLK_1 in each period being an unfixed value. As a result, not only the sampling clocks CLK_1 to CLK_n can be offset or corrected, but the skew tone is reduced or suppressed.

Figure 4:
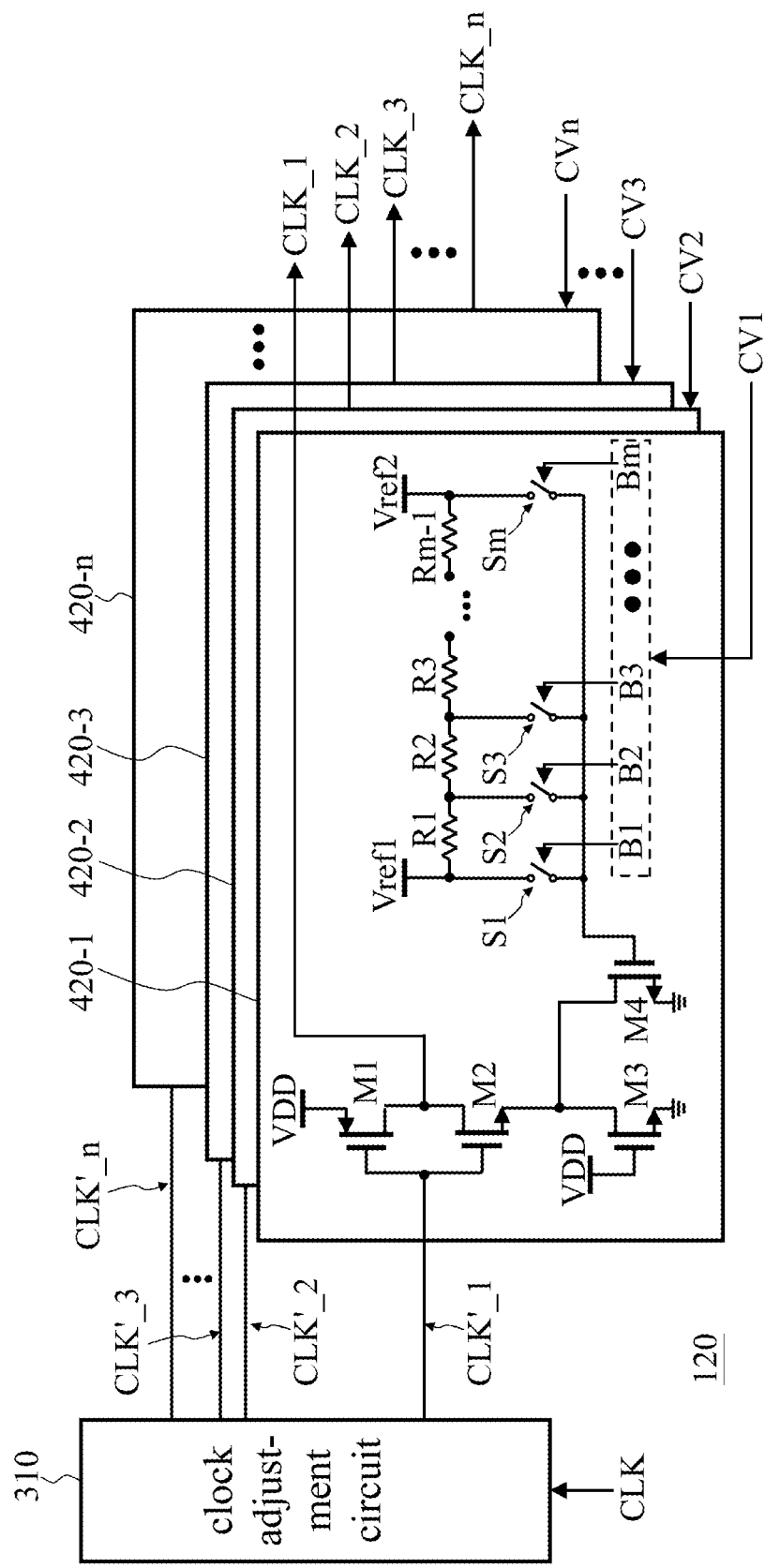
FIG. 4 is a circuit diagram of the clock generation circuit 120 according to another embodiment of the present invention.

FIG. 4 is a circuit diagram of the clock generation circuit 120 according to an embodiment of the present invention. The clock generation circuit 120 includes a clock adjustment circuit 310 and n phase adjustment circuits 420 (420-1, 420-2, 420-3, ..., 420-n). Each phase adjustment circuit 420 includes a transistor M1, a transistor M2, a transistor M3, a transistor M4, m–1 resistors (R1, R2, R3, ..., Rm–1) connected in series and m switches S. Each phase adjustment circuit 420 receives the intermediate clock (CLK'_1, CLK'_2, CLK'_3, ..., CLK'_n) generated by the clock adjustment circuit 310, and generates the sampling clock (CLK_1, CLK_2, CLK_3, ..., CLK_n). The transistor M1 and the transistor M2 form an inverter which increases the driving capability of the intermediate clock. The m–1 resistors are connected in series between the reference voltage Vref1 (e.g., 0.75*working voltage VDD) and the reference voltage Vref2 (e.g., 0.25*working voltage VDD), and the reference voltage Vref1 is different from the reference voltage Vref2. By controlling the switch S to be turned on or off, the control value CV can adjust the gate voltage of the transistor M4. For example, when only the switch S1 is turned on, the gate voltage of the transistor M4 is the reference voltage Vref1, when only the switch Sm is turned on, the gate voltage of the transistor M4 is the reference voltage Vref2, and when any of the other switches is turned on, the gate voltage of the transistor M4 is between the reference voltage Vref1 and the reference voltage Vref2. By changing the gate voltage of the transistor M4, the bias voltage of the transistor M2 is changed, which in turn delays or advances the phase of the sampling clock.

The control circuit 130 may be implemented using a digital signal processor (DSP). For more information about pseudo random numbers, please refer to: "en.wikipedia.org/wiki/Pseudorandom_number_generator" and "en.wikipedia.org/wiki/Linear-feedback_shift_register."

Figure 5A:
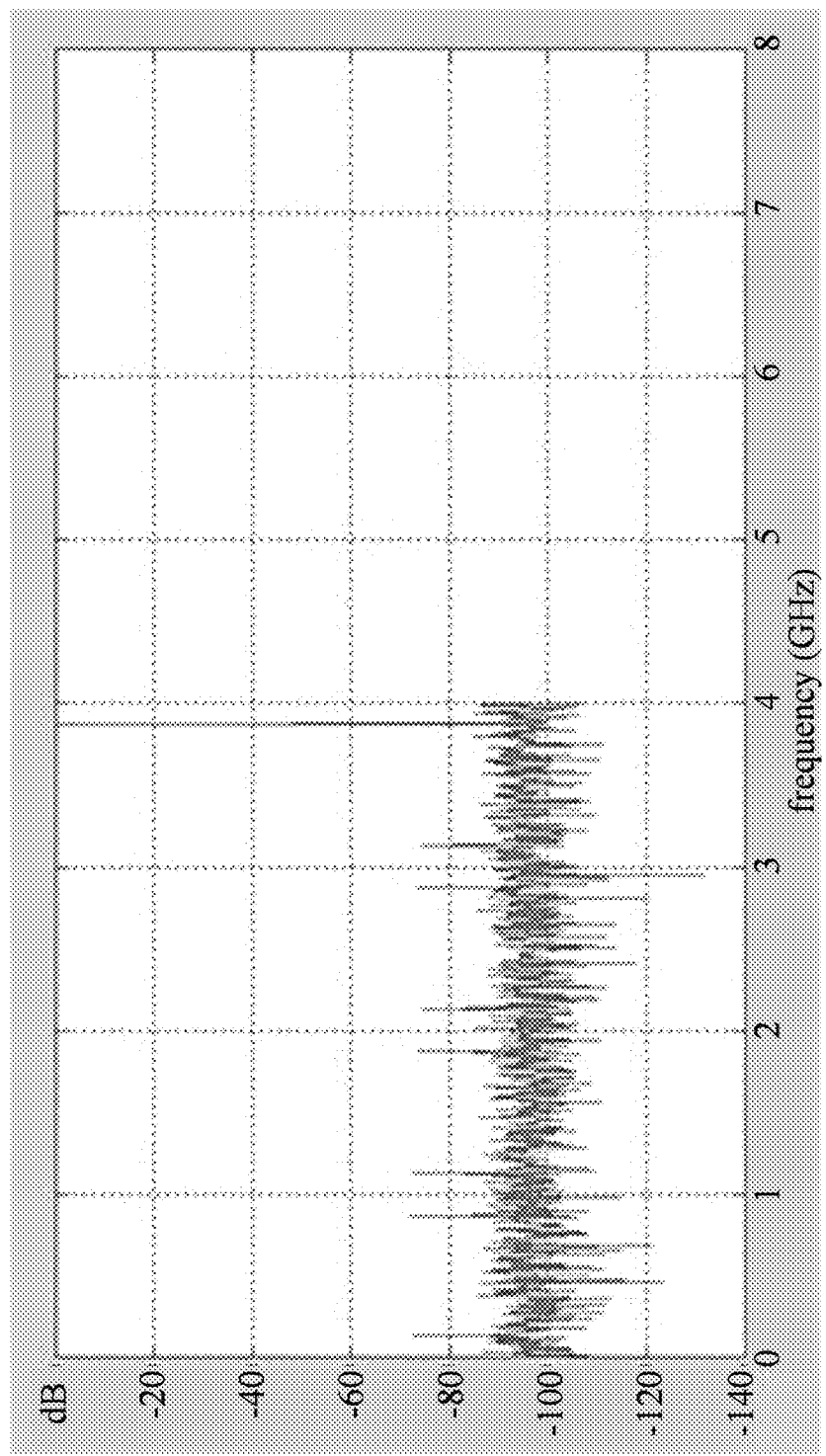
FIGS. 5A and 5B show the spurious-free dynamic range (SFDR) of the TIADCs from the prior art and the present invention.
Figure 5B:
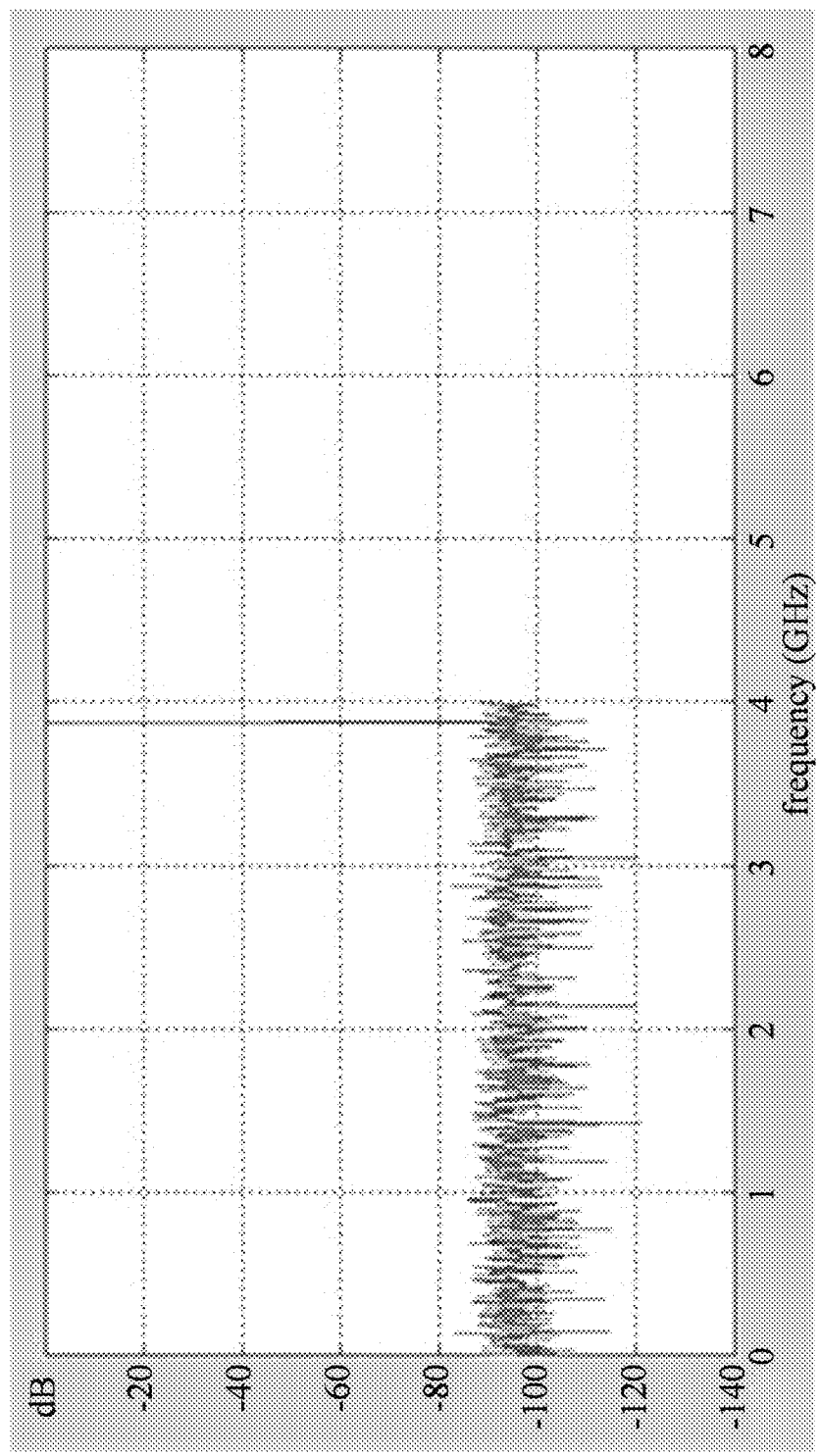

FIG. 5A and FIG. 5B show the relationships between the spurious-free dynamic range (SFDR) and frequencies for the TIADCs. It is observed that the TIADC that does not use the random control values or pseudo random numbers (FIG. 5A) has several skew tones, resulting in an SFDR of about 71 dB, whereas the TIADC that uses the random control values or pseudo random numbers (FIG. 5B) has no obvious skew tone, which greatly increases the SFDR to about 82 dB.

Noted that the skew tone can be reduced or suppressed even when only one control value in one set of control values CV (i.e., one of the control values CV1, CV2, CV3, ..., and CVn) is a random number or is generated based on a pseudo random number. The sampling clock corresponding to an unfixed control value (i.e., the control value is a random number or is generated based on a pseudo random number) is of an unfixed phase (i.e., the phase is not fixed).

The shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto.

Various equivalent changes, alterations, or modifications based on the claims of the present invention are all consequently viewed as being embraced by the scope of the present invention.

What is claimed is:

1. A time interleaved analog-to-digital converter (TIADC) for converting an input signal into a digital output signal, comprising:
    a first analog-to-digital converter (ADC) for receiving the input signal and sampling the input signal according to a first sampling clock to generate a first digital output code;
    a second ADC for receiving the input signal and sampling the input signal according to a second sampling clock to generate a second digital output code;
    a third ADC for receiving the input signal and sampling the input signal according to a third sampling clock to generate a third digital output code;
    a fourth ADC for receiving the input signal and sampling the input signal according to a fourth sampling clock to generate a fourth digital output code;
    a control circuit coupled to the first ADC, the second ADC, the third ADC, and the fourth ADC, for periodically generating at least a part of a set of control values randomly, and for outputting the first digital output code, the second digital output code, the third digital output code, and the fourth digital output code in turn as the digital output signal; and
    a clock generation circuit coupled to the first ADC, the second ADC, the third ADC, the fourth ADC, and the control circuit, for receiving a working clock, and generating the first sampling clock, the second sampling clock, the third sampling clock, and the fourth sampling clock according to the set of control values and the working clock, so that a phase of at least one of the first sampling clock, the second sampling clock, the third sampling clock, and the fourth sampling clock is not fixed.

2. The TIADC of claim 1, wherein the control circuit generates the set of control values based on a pseudo random number.

3. The TIADC of claim 1, wherein the clock generation circuit comprises:
    a clock adjustment circuit for generating a first intermediate clock, a second intermediate clock, a third intermediate clock, and a fourth intermediate clock according to the working clock; and
    a plurality of phase adjustment circuits for adjusting the phases of the first intermediate clock, the second intermediate clock, the third intermediate clock, and the fourth intermediate clock according to the set of control values to generate the first sampling clock, the second sampling clock, the third sampling clock, and the fourth sampling clock, respectively.

4. A time interleaved analog-to-digital converter (TIADC) for converting an input signal into a digital output signal, comprising:
    N analog-to-digital converters (ADCs), each of which receives the input signal and samples the input signal according to one of N sampling clocks to generate a digital output code, N being an integer greater than or equal to two;
    a clock generation circuit coupled to the N ADCs, for receiving a working clock and a set of control values, and generating the N sampling clocks according to the set of control values and the working clock; and
    a control circuit coupled to the N ADCs and the clock generation circuit, for periodically generating the set of control values, and outputting the digital output codes in turn as the digital output signal;
    wherein two consecutive sets of control values are not identical.

5. The TIADC of claim 4, wherein the clock generation circuit frequency-divides the working clock to generate a low-frequency clock, delays the low-frequency clock to generate N intermediate clocks, and delays the N intermediate clocks according to the set of control values to generate the N sampling clocks, so that at least one of the N sampling clocks has different phases for two consecutive periods.

6. The TIADC of claim 5, wherein the clock generation circuit comprises:
    a clock adjustment circuit for frequency-dividing the working clock to generate the low-frequency clock, and delaying the low-frequency clock to generate the N intermediate clocks; and
    N phase adjustment circuits coupled to the clock adjustment circuit, for adjusting phases of the N intermediate clocks according to the set of control values to generate the N sampling clocks, respectively.

7. A time interleaved analog-to-digital converter (TIADC) for converting an input signal into a digital output signal, comprising:
    N analog-to-digital converters (ADCs), each of which receives the input signal and samples the input signal according to one of N sampling clocks to generate a digital output code, N being an integer greater than or equal to two;
    a clock generation circuit coupled to the N ADCs, for receiving a working clock and a set of control values, and generating the N sampling clocks according to the set of control values and the working clock; and
    a control circuit coupled to the N ADCs and the clock generation circuit, for periodically generating the set of control values based on a pseudo random number, and outputting the digital output codes in turn as the digital output signal.

8. The TIADC of claim 7, wherein the clock generation circuit frequency-divides the working clock to generate a low-frequency clock, delays the low-frequency clock to generate N intermediate clocks, and delays the N intermediate clocks according to the set of control values to generate the N sampling clocks, so that at least one of the N sampling clocks has different phases for two consecutive periods.

9. The TIADC of claim 8, wherein the clock generation circuit comprises:
    a clock adjustment circuit for frequency-dividing the working clock to generate the low-frequency clock, and delaying the low-frequency clock to generate the N intermediate clocks; and
    N phase adjustment circuits coupled to the clock adjustment circuit, for adjusting phases of the N intermediate clocks according to the set of control values to generate the N sampling clocks, respectively.

* * * * *